United States Patent [19]
Van Auken

[11] Patent Number: 5,831,893
[45] Date of Patent: Nov. 3, 1998

[54] MEMORY CELL

[75] Inventor: Jeffrey B. Van Auken, Littleton, Mass.

[73] Assignee: Sipex Corporation, Billerica, Mass.

[21] Appl. No.: 900,313

[22] Filed: Jul. 25, 1997

Related U.S. Application Data

[60] Provisional application No. 60/046,364, May 13, 1997.

[51] Int. Cl.[6] .................................................. G11C 17/06
[52] U.S. Cl. .......................... 365/100; 365/105; 365/115; 365/148; 365/175; 365/189.05
[58] Field of Search ..................................... 365/100, 105, 365/115, 148, 175, 189.05

[56] References Cited

U.S. PATENT DOCUMENTS

| | | | |
|---|---|---|---|
| 4,182,024 | 1/1980 | Cometta | 29/571 |
| 4,233,671 | 11/1980 | Gerzberg et al. | 365/105 |
| 4,590,589 | 5/1986 | Gierzberg | 365/100 |
| 4,647,906 | 3/1987 | Naylor et al. | 340/347 DA |
| 5,418,738 | 5/1995 | Abadeer et al. | 365/100 |
| 5,572,472 | 11/1996 | Kearney et al. | 365/175 X |
| 5,602,483 | 2/1997 | Uhling et al. | 324/601 |
| 5,684,737 | 11/1997 | Wang et al. | 365/175 |

*Primary Examiner*—Do Hyun Yoo
*Attorney, Agent, or Firm*—Testa, Hurwitz & Thibeault, LLP

[57] ABSTRACT

A read-only memory cell capable of being programmed by the application of radiant energy. The memory cell includes a trimmable resistor, a diode and a latch. In one embodiment, the cathode of the diode is in electrical communication with a first terminal of the resistor and the anode of the diode is in electrical communication with the second terminal of the resistor. The latch has an input terminal in electrical communication with the second terminal of the resistor and an output terminal. The latch is in a first state when the trimmable resistor is untrimmed and is in a second state when the trimmable resistor is trimmed. In one embodiment, the trimmable resistor is trimmable by laser energy. The invention also relates to a method of storing data in a memory cell.

9 Claims, 6 Drawing Sheets

MEMORY CELL

Priority Information

This application claims the benefit of U.S. Provisional application Ser. No. 60/046,364, filed on May 13, 1997.

1. Field of the Invention

The invention relates generally to programmable read-only memory cells and more specifically to a programmable read-only memory cell which may be programmed by the application of radiant energy.

2. Background of the Invention

A read-only memory (ROM) is a storage device containing data that, under normal circumstances, can be read but not modified. Commercial ROM types include programmable read-only memories (PROMs), erasable programmable read-only memories (EPROMs), and electronically erasable programmable read-only memories (EEPROMs). A PROM is a type of ROM that allows data to be written into the device only once. After a PROM has been programmed it cannot be reprogrammed. EPROMs and EEPROMs are types of ROM which can be programmed, erased and then reprogrammed.

In many known PROMs, to store information a diode or transistor either remains present or is removed from the circuit. In these known PROMs, the presence or absence of a diode or transistor distinguishes between a logic "0" and a logic "1". For example, if the diode or transistor is present, a "1" is stored; and if the diode or transistor is absent, a "0" is stored. A PROM chip is typically manufactured with all of its diodes or transistors "present" in the circuit. Having all of the diodes or transistors present corresponds to the PROM having all of its bits at a particular value. To "program" the PROM, the links connecting a diode or transistor into the circuit are either left in place or are removed.

Some known semiconductor PROMs are programmed after fabrication through the application of high voltages to the PROMs. The application of high voltages renders only selected transistor components conductive. Another known method for programming PROMs is by vaporizing the link connecting the applicable transistor or diode to the circuit by the application of laser energy.

The present invention relates to a programmable read-only memory cell which may be programmed by the application of radiant energy.

SUMMARY OF THE INVENTION

The invention relates to a read-only memory cell capable of being programmed by the application of radiant energy. The memory cell includes a trimmable resistor, a diode and a latch. In one embodiment, the cathode of the diode is in electrical communication with a first terminal of the resistor and the anode of the diode is in electrical communication with a second terminal of the resistor. The latch has an input terminal in electrical communication with the second terminal of the resistor and an output terminal. The latch is in a first state when the trimmable resistor is untrimmed and is in a second state when the trimmable resistor is trimmed. In one embodiment, the trimmable resistor is trimmable by laser energy.

To store a data item in the memory cell, the trimmable resistor is trimmed. In one embodiment, to store a data item, the trimmable resistor is trimmed until the resistor is removed from the memory cell. In another embodiment, the trimmable resistor may be only partially trimmed to store a data item. In yet another embodiment, the data item is stored in the memory cell by subjecting the trimmable resistor to a predetermined quantity of radiant energy.

BRIEF DESCRIPTION OF THE INVENTION

This invention is pointed out with particularity in the appended claims. The above and further advantages of this invention may be better understood by referring to the following description taken in conjunction with the accompanying drawings, in which:

Figure 4:
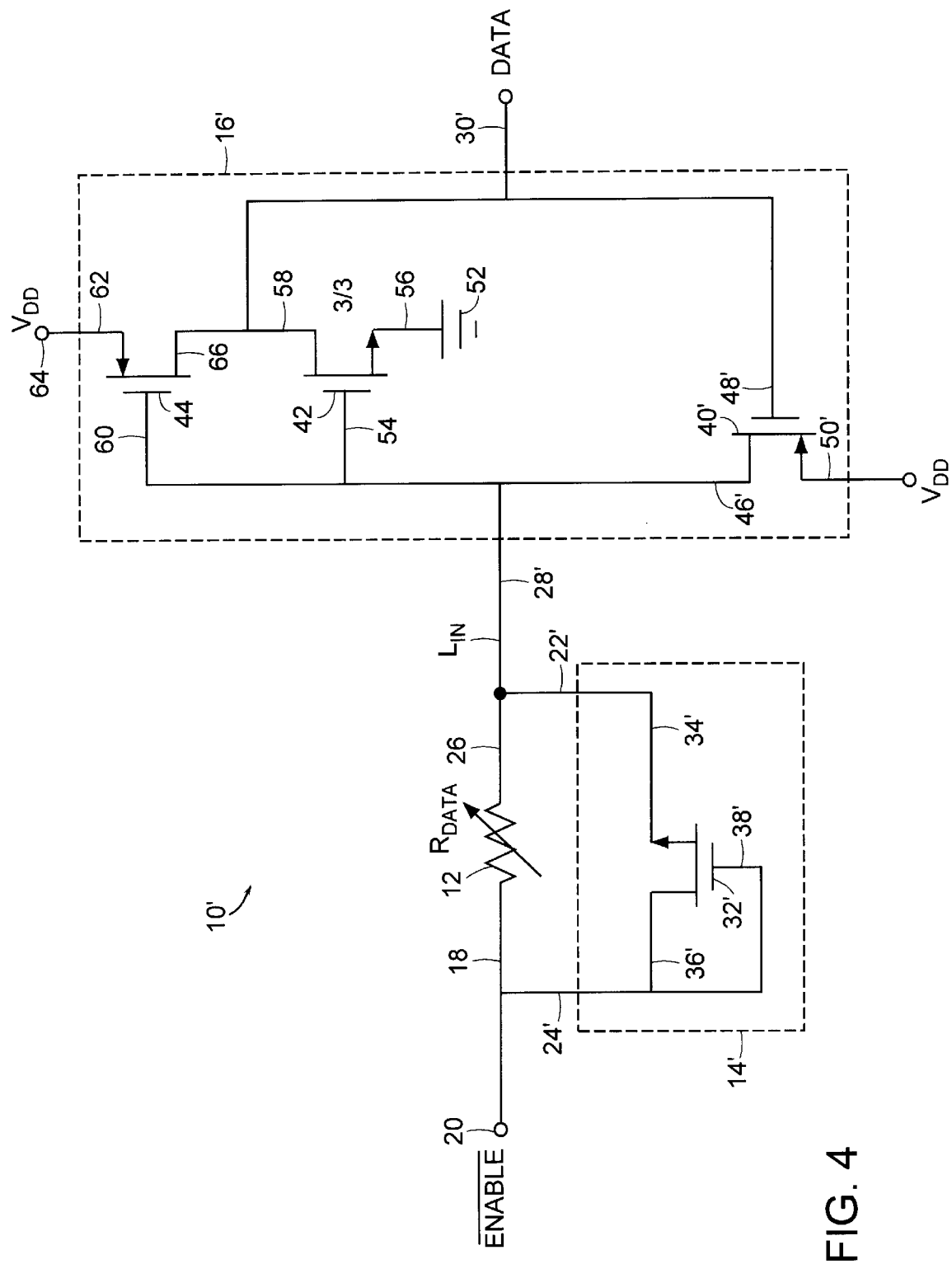
FIG. 4 is a block diagram of another embodiment of a memory cell in accordance with the present invention.
Figure 5:
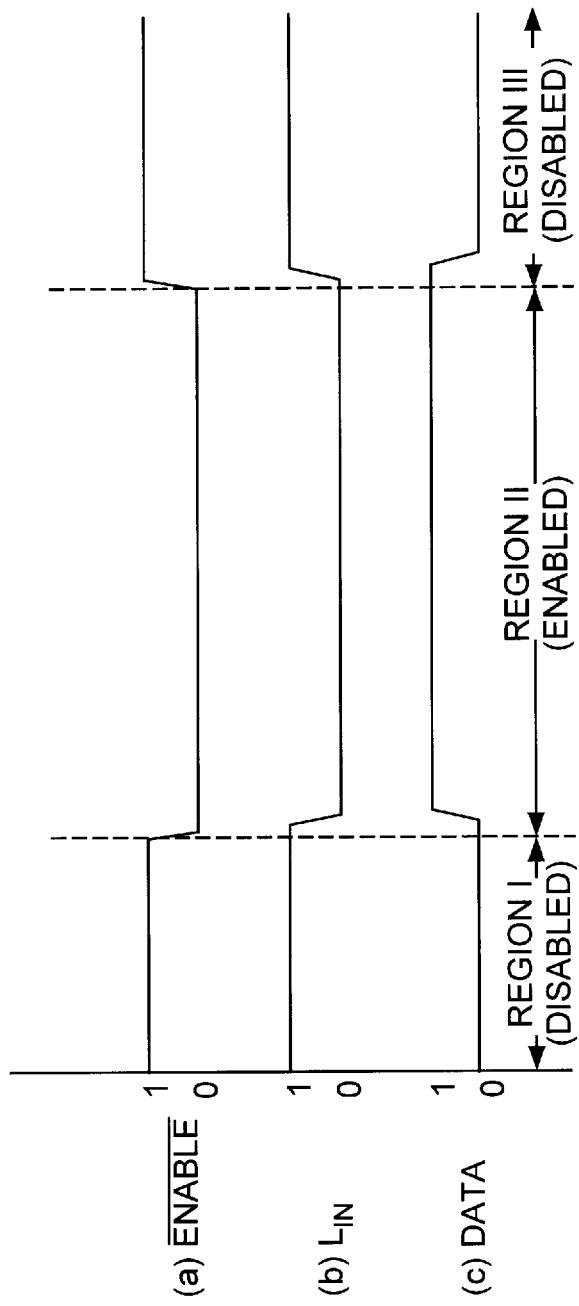
Figure 6:
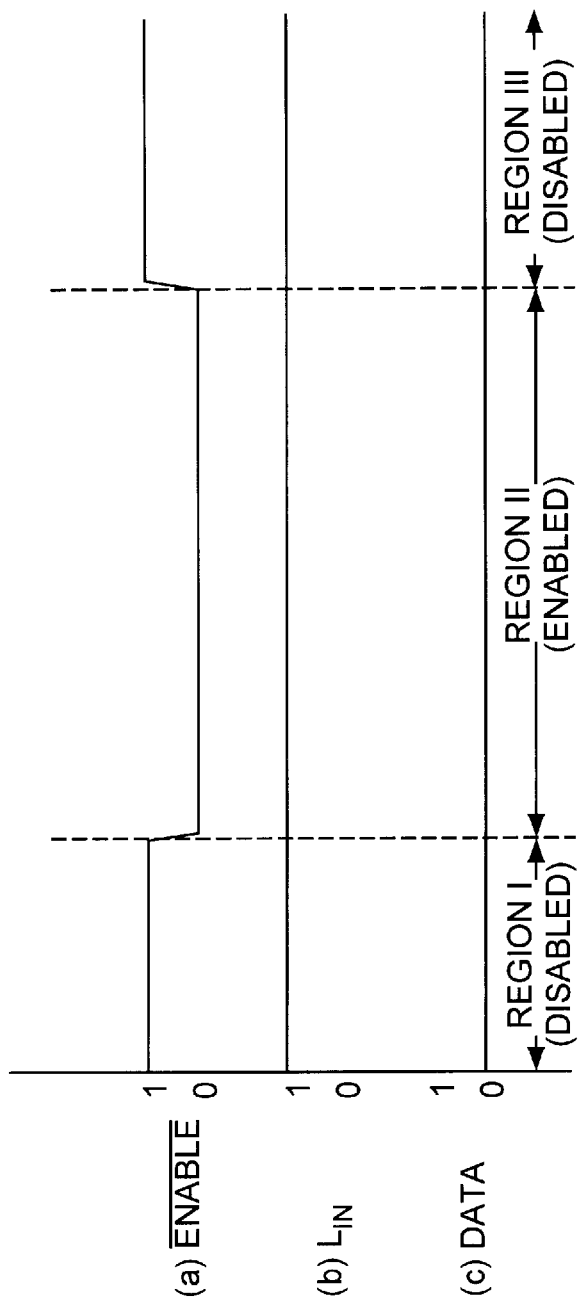

FIG. 5 is a timing diagram of a control signal associated with the embodiment of the memory cell shown in FIG. 4 and is a series of waveforms produced during each mode of operation of the embodiment of the memory cell shown in FIG. 4 when the trimmable resistor is untrimmed; and FIG. 6 is a timing diagram of a control signal associated with the embodiment of the memory cell shown in FIG. 4 and is a series of waveforms produced during each mode of operation of the embodiment of the memory cell shown in FIG. 4 after the trimmable resistor has been trimmed.

Like reference characters in the respective drawn figures indicate corresponding parts.

DETAILED DESCRIPTION OF THE INVENTION

Figure 1:
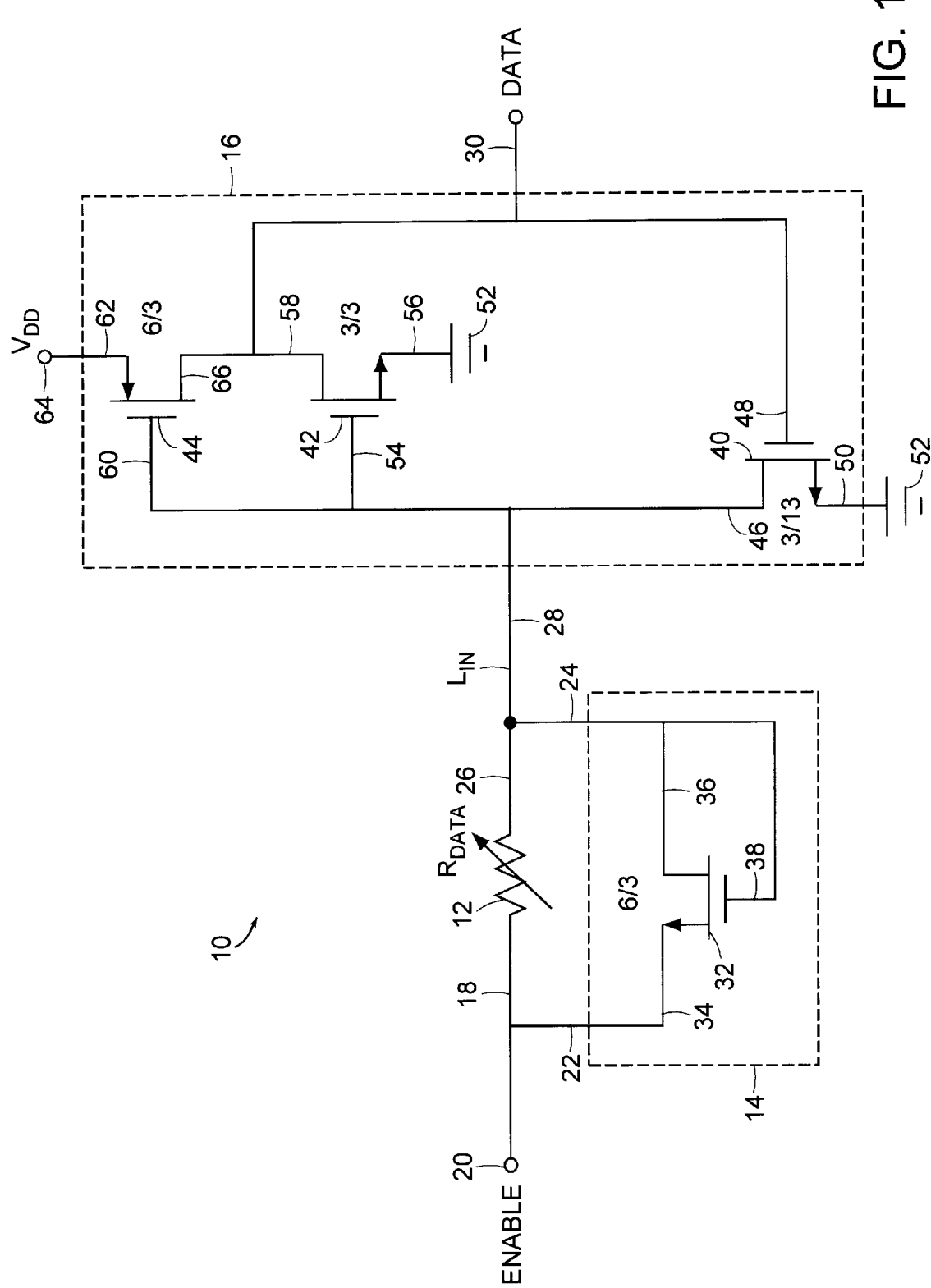
FIG. 1 is a block diagram of an embodiment of a memory cell in accordance with the present invention.

Referring to FIG. 1 and in brief overview, an embodiment of a memory cell 10 constructed in accordance with the invention includes a trimmable resistor RDATA 12, a diode 14, and a latch 16. The resistor RDATA 12 has a first terminal 18 electrically coupled to an ENABLE signal through an input signal port 20. In one embodiment, the resistor $R_{DATA}$ 12 has resistance approximately equal to 7.75 kΩ. The cathode 22 of the diode 14 is electrically coupled to the first terminal 18 of the resistor $R_{DATA}$ 12 and the anode 24 of the diode 14 is electrically coupled to the second terminal 26 of the resistor $R_{DATA}$ 12. The latch 16 has an input terminal 28 electrically coupled to the second terminal 26 of the resistor $R_{DATA}$ 12 and a DATA output terminal 30. When the trimmable resistor $R_{DATA}$ 12 is untrimmed, the latch 16 is in a first state and when the trimmable resistor $R_{DATA}$ 12 is trimmed, the latch 16 is in a second state. The two states of the latch 16 may be used to store data items.

In one embodiment, the diode 14 is an N-channel metal-oxide-semiconductor field effect transistor (MOSFET) 32 having a source terminal 34 being the cathode 22 of the diode 14, a drain terminal 36 being the anode 24 of the diode 14, and a gate terminal 38 electrically coupled to the drain terminal 36.

In another embodiment, the latch 16 includes two N-channel MOSFETs 40, 42 and one P-channel MOSFET 44. The first N-channel MOSFET 40 has a drain terminal 46 electrically coupled to the input terminal 28 of the latch 16, a gate terminal 48 electrically coupled to the DATA output terminal 30 of the latch 16, and a source terminal 50 electrically coupled to a first reference voltage 52. In one embodiment, the first reference voltage 52 is ground. The second N-channel MOSFET 42 has a gate terminal 54 electrically coupled to the input terminal 28 of the latch 16, a source terminal 56 electrically coupled to the first reference voltage 52, and a drain terminal 58 electrically coupled to the DATA output terminal 30 of the latch 16. The P-channel MOSFET 44 has a gate terminal 60 electrically coupled to the input terminal 28 of the latch 16, a source terminal 62 electrically coupled to a second reference voltage VDD through an input terminal 64, and a drain terminal 66 electrically coupled to the DATA output terminal 30 of the latch 16.

To store a data item in the memory cell 10, the trimmable resistor $R_{DATA}$ 12 either remains untrimmed or is trimmed. In one embodiment, the trimmable resistor $R_{DATA}$ 12 is trimmable by radiant energy. The radiant energy may be obtained from a pulsed laser. In another embodiment, to store a data item the resistor $R_{DATA}$ 12 is trimmed until the resistor $R_{DATA}$ 12 is completely removed from the memory cell 10. In yet another embodiment, to store a data item the resistor $R_{DATA}$ 12 may be only partially trimmed.

Figure 2:
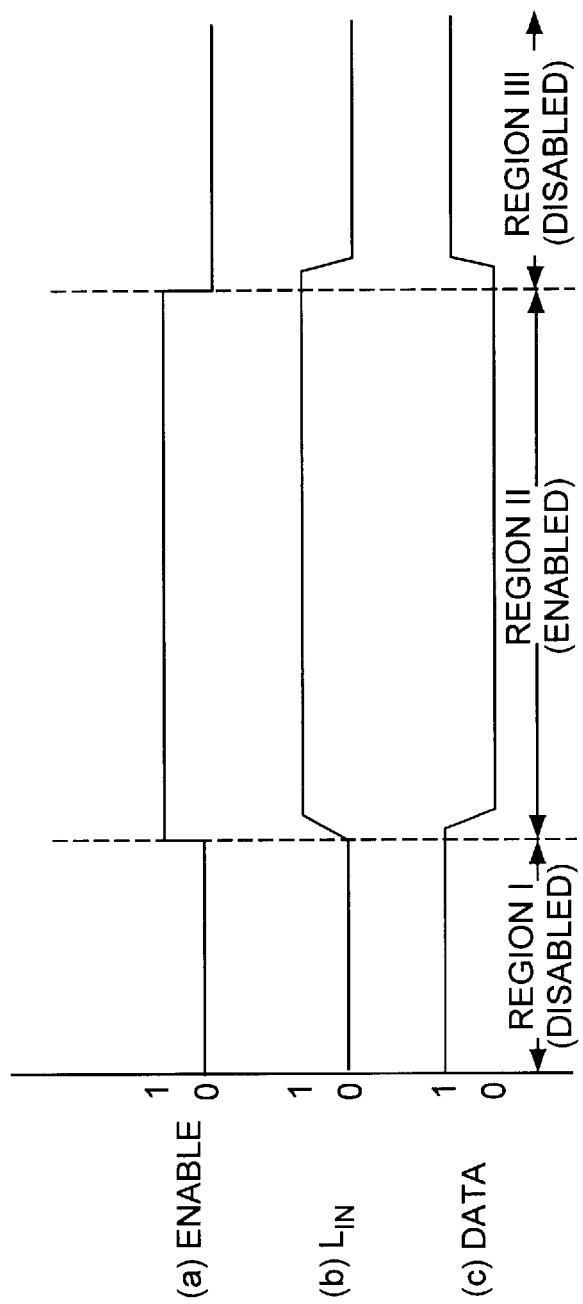
FIG. 2 is a timing diagram of a control signal associated with the embodiment of the memory cell shown in FIG. 1 and is a series of waveforms produced during each mode of operation of the embodiment of the memory cell shown in FIG. 1 when the trimmable resistor is untrimmed.

The memory cell 10 has two memory states. The first memory state corresponds to the resistor $R_{DATA}$ 12 being untrimmed and the second memory state corresponds to the resistor $R_{DATA}$ 12 being completely or partially trimmed. FIG. 2 is a timing diagram of the control signal ENABLE, and the state of the signals produced at the input terminal 28 of the latch 16 and at the DATA output terminal 30 when the trimmable resistor $R_{DATA}$ 12 is untrimmed. Waveform (a) depicts the control signal ENABLE which enables the memory cell 10 and causes the memory cell 10 to output the data item stored in the memory cell 10 at the DATA output terminal 30. When the ENABLE signal is low or unasserted, the memory cell 10 is not enabled and does not output the data item at the DATA output terminal 30. When the ENABLE signal is high or asserted, the memory cell 10 is enabled and outputs the data item stored in the memory cell 10 at the DATA output terminal 30. Waveform (b) represents the state of the signal $L_{IN}$ at the input terminal 28 of the latch 16 and waveform (c) represents the state of the DATA signal at the DATA output terminal 30.

To read the data item stored in the memory cell 10, the latch 16 of the memory cell 10 is first preset to a known state (REGION I). In the embodiment illustrated by the timing diagram in FIG. 2, the latch 16 is preset such that the DATA signal is high or asserted when the ENABLE signal is low or unasserted. During this preset interval, the signal LIN at the input terminal 28 of the latch 16 is low or unasserted. Next, the memory cell 10 is enabled (REGION II). To enable the memory cell 10, the ENABLE signal switches high or is asserted. When the ENABLE signal is high or asserted, the states of the signal Lr at the input terminal 28 of the latch 16 and the DATA signal at the DATA output terminal 30 are determined by the presence or absence of the resistor $R_{DATA}$ 12. In the embodiment described by the timing diagram in FIG. 2 the trimmable resistor $R_{DATA}$ 12 is untrimmed or "present" in the memory cell 10. As the trimmable resistor $R_{DATA}$ 12 is untrimmed, the state of the signal LIN is high or asserted and the state of the DATA signal is low or unasserted. After the data item stored in the memory cell 10 is read, the memory cell 10 is disabled or "shutdown" (REGION III). One purpose of shutting down the memory cell 10 is to conserve power. The arrangement of the circuit components in the memory cell 10 ensures low power dissipation by the memory cell 10 when the ENABLE signal is low or unasserted. To shut down the memory cell 10, the ENABLE signal switches low which causes the LIN signal to switch low and the DATA signal to switch high.

Figure 3:
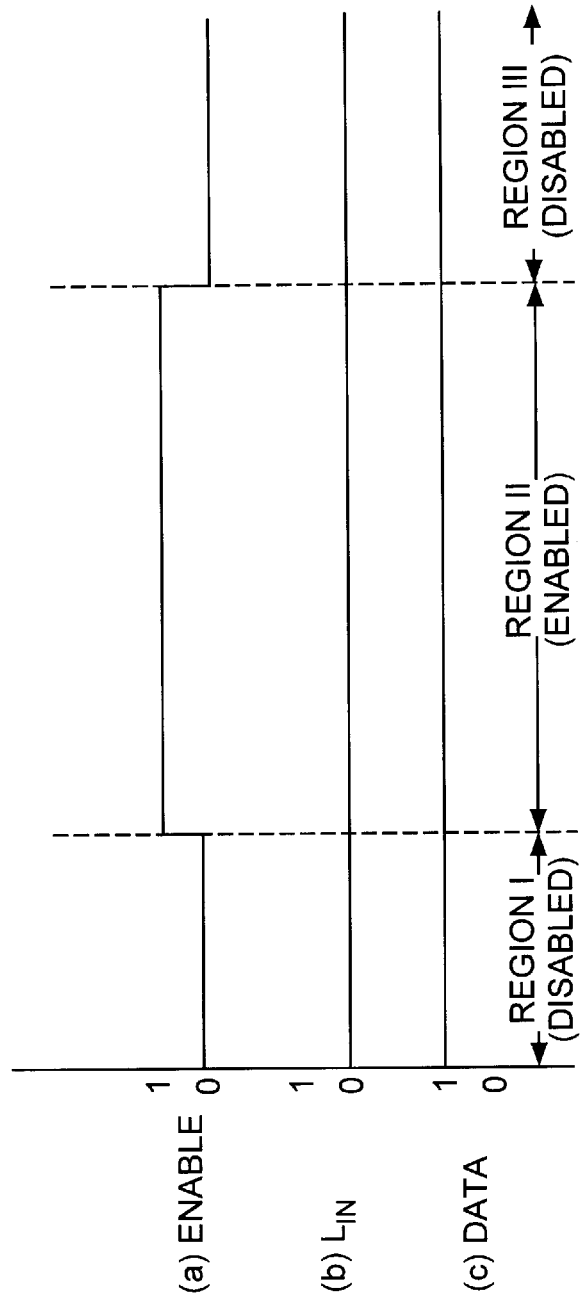
FIG. 3 is a timing diagram of a control signal associated with the embodiment of the memory cell shown in FIG. 1 and is a series of waveforms produced during each mode of operation of the embodiment of the memory cell shown in FIG. 1 after the trimmable resistor has been trimmed.

FIG. 3 is a timing diagram of the control signal ENABLE, and the state of the signals produced at the input terminal 28 of the latch 16 and at the DATA output terminal 30 when the trimmable resistor $R_{DATA}$ 12 is trimmed. In one embodiment, the resistor $R_{DATA}$ 12 is only partially trimmed to produce the waveforms of FIG. 3. In another embodiment, the resistor $R_{DATA}$ 12 is trimmed until the resistor $R_{DATA}$ 12 is completely removed from the memory cell 10 to produce the waveforms shown in FIG. 3. Similar to the timing diagram in FIG. 2, waveform (a) depicts the control signal ENABLE which enables the memory cell 10 and causes the memory cell 10 to output the data item stored in the memory cell 10 at the DATA output terminal 30. When the ENABLE signal is low or unasserted, the memory cell 10 is not enabled and does not output the data item at the DATA output terminal 30. When the ENABLE signal is high or asserted, the memory cell 10 is enabled and outputs the data item stored in the memory cell 10 at the DATA output terminal 30. Also similar to the timing diagram in FIG. 2, waveform (b) represents the state of the signal LIN at the input terminal 28 of the latch 16 and waveform (c) represents the state of the DATA signal at the DATA output terminal 30.

To read the data item stored in the memory cell 10, the latch 16 of the memory cell 10 is first preset to a known state (REGION I). In the embodiment illustrated by the timing diagram in FIG. 3, the latch 16 is preset such that the DATA signal is high or asserted when the ENABLE signal is low or unasserted. When the memory cell 10 is powered up, to preset the latch 16, the ENABLE signal is low or unasserted. The diode 14 forces the latch 16 to the known state and thereby causes the signal LIN to be pulled low. Without the diode 14, the signal LIN could be charged high or asserted upon powering up the memory cell 10 and the memory cell 10 may not be able to recover and function properly.

Next, the memory cell 10 is enabled (REGION II). To enable the memory cell 10, the ENABLE signal switches high or is asserted. As the trimmable resistor $R_{DATA}$ 12 is trimmed, the state of the signal LIN remains low or unasserted and the state of the DATA signal remains high or asserted. After the data item stored in the memory cell 10 has been read, the memory cell 10 is disabled or "shutdown" (REGION III). In addition to conserving power, another purpose of shutting down the memory cell 10 is to allow the data item to be stored in the memory cell 10 by only partially trimming the resistor $R_{DATA}$ 12 rather than requiring the resistor $R_{DATA}$ 12 to be completely removed. Shutting down the memory cell 10 after the data item stored in the memory cell 10 is read prevents a current from leaking through any remnants of the resistor $R_{DATA}$ 12 if the resistor $R_{DATA}$ 12 has been only partially trimmed and not completely removed from the memory cell 10. If the resistor $R_{DATA}$ 12 is only partially trimmed and the ENABLE signal remains high or asserted, a leakage path through the resistor $R_{DATA}$ 12 may be created as the input terminal 28 of the latch 16 is at ground. To prevent the leakage current and shut down the memory cell 10, the ENABLE signal switches low. During shutdown (REGION III), the ENABLE signal is low or unasserted, and the diode 14 pulls the signal LIN low which causes the latch 16 to reset to the known state of the DATA signal (high or asserted). As both the ENABLE signal and the LIN signal are low or unasserted during shutdown, there is no potential across the resistor $R_{DATA}$ 12 and therefore no leakage current.

In another embodiment, a plurality of memory cells 10 are used to store a plurality of data items as described above.

Referring to FIG. 4 another embodiment of a memory cell 10' constructed in accordance with the invention includes a trimmable resistor $R_{DATA}$ 12, a diode 14', and a latch 16'. The resistor $R_{DATA}$ 12 has a first terminal 18 electrically coupled to an $\overline{\text{ENABLE}}$ signal through an input signal port 20. In one embodiment, the resistor $R_{DATA}$ 12 has resistance approximately equal to 7.75 kΩ. The anode 24' of the diode 14' is electrically coupled to the first terminal 18 of the resistor $R_{DATA}$ 12 and the cathode 22' of the diode 14' is electrically coupled to the second terminal 26 of the resistor $R_{DATA}$ 12. The latch 16' has an input terminal 28' electrically coupled to the second terminal 26 of the resistor $R_{DATA}$ 12 and a DATA output terminal 30'. When the trimmable resistor $R_{DATA}$ 12 is untrimmed, the latch 16' is in a first state and when the trimmable resistor $R_{DATA}$ 12 is trimmed, the latch 16' is in a second state.

In one embodiment, the diode 14' is an N-channel MOSFET 32' having a source terminal 34' being the cathode 22' of the diode 14', a drain terminal 36' being the anode 24' of the diode 14', and a gate terminal 38' electrically coupled to the drain terminal 36'.

In another embodiment, the latch 16' includes one N-channel MOSFET 42 and two P-channel MOSFETs 40', 44. The N-channel MOSFET 42 has a gate terminal 54 electrically coupled to the input terminal 28' of the latch 16', a source terminal 56 electrically coupled to a first reference voltage 52, and a drain terminal 58 electrically coupled to the DATA output terminal 30' of the latch 16'. In one embodiment, the first reference voltage 52 is ground. The first P-channel MOSFET 40' has a drain terminal 46' electrically coupled to the input terminal 28' of the latch 16', a gate terminal 48' electrically coupled to the DATA output terminal 30' of the latch 16', and a source terminal 50' electrically coupled to a second reference voltage $V_{DD}$. The second P-channel MOSFET 44 has a gate terminal 60 electrically coupled to the input terminal 28' of the latch 16', a source terminal 62 electrically coupled to the second reference voltage $V_{DD}$ through an input terminal 64, and a drain terminal 66 electrically coupled to the DATA output terminal 30' of the latch 16'. In the embodiment shown in FIG. 4, the latch 16' is preset such that the DATA signal is low or unasserted upon start-up.

To store a data item in the memory cell 10', the trimmable resistor $R_{DATA}$ 12 either remains untrimmed or is trimmed. In one embodiment, the trimmable resistor $R_{DATA}$ 12 is trimmable by radiant energy. The radiant energy may be obtained from a pulsed laser. In another embodiment, to store a data item, the resistor $R_{DATA}$ 12 is trimmed until the resistor $R_{DATA}$ 12 is completely removed from the memory cell 10'. In another embodiment, to store a data item, the resistor $R_{DATA}$ 12 may be only partially trimmed.

The memory cell 10' has two memory states. The first memory state corresponds to the resistor $R_{DATA}$ 12 being untrimmed and the second memory state corresponds to the resistor $R_{DATA}$ 12 being completely or partially trimmed. FIG. 5 is a timing diagram of the control signal $\overline{\text{ENABLE}}$, and the state of the signals produced at the input terminal 28' of the latch 16' and at the DATA output terminal 30' when the trimmable resistor $R_{DATA}$ 12 is untrimmed. Waveform (a) depicts the control signal $\overline{\text{ENABLE}}$ which enables the memory cell 10' and causes the memory cell 10' to output the data item stored in the memory cell 10' at the DATA output terminal 30'. When the $\overline{\text{ENABLE}}$ signal is high or asserted, the memory cell 10' is not enabled and does not output the data item at the DATA output terminal 30'. When the $\overline{\text{ENABLE}}$ signal is low or unasserted, the memory cell 10' is enabled and outputs the data item stored in the memory cell 10' at the DATA output terminal 30'. Waveform (b) represents the state of the signal $L_{IN}$ at the input terminal 28' of the latch 16' and waveform (c) represents the state of the DATA signal at the DATA output terminal 30'.

To read the data item stored in the memory cell 10', the latch 16' of the memory cell 10' is first preset to a known state (REGION I). In the embodiment illustrated by the timing diagram in FIG. 5, the latch 16' is preset such that the DATA signal is low or unasserted when the $\overline{\text{ENABLE}}$ signal is high or asserted. During this preset interval, the signal $L_{IN}$ at the input terminal 28' of the latch 16' is high or asserted. Next, the memory cell 10' is enabled (REGION II). To enable the memory cell 10', the $\overline{\text{ENABLE}}$ signal switches low or is unasserted. When the $\overline{\text{ENABLE}}$ signal is low or unasserted, the states of the signal $L_{IN}$ at the input terminal 28' of the latch 16' and the DATA signal at the DATA output terminal 30' are determined by the presence or absence of the resistor $R_{DATA}$ 12. In the embodiment described by the timing diagram in FIG. 5, the trimmable resistor $R_{DATA}$ 12 is untrimmed or "present" in the memory cell 10'. As the trimmable resistor $R_{DATA}$ 12 is untrimmed, the state of the signal $L_{IN}$ is low or unasserted and the state of the DATA signal is high or asserted. After the data item stored in the memory cell 10' is read, the memory cell 10' is disabled or "shutdown" (REGION III). Similar to the memory cell 10 described above and shown in FIG. 1, one purpose of shutting down the memory cell 10' is to conserve power. The arrangement of the circuit components in the memory cell 10' ensures low power dissipation by the memory cell 10' when the $\overline{\text{ENABLE}}$ signal is high or asserted. To shut down the memory cell 10', the $\overline{\text{ENABLE}}$ signal switches high which causes the $L_{IN}$ signal to switch high and the DATA signal to switch low.

FIG. 6 is a timing diagram of the control signal $\overline{\text{ENABLE}}$, and the state of the signals produced at the input terminal 28' of the latch 16' and at the DATA output terminal 30' when the trimmable resistor $R_{DATA}$ 12 is trimmed. In one embodiment, the resistor $R_{DATA}$ 12 is only partially trimmed to produce the waveforms of FIG. 6. In another embodiment, the resistor $R_{DATA}$ 12 is trimmed until the resistor $R_{DATA}$ 12 is completely removed from the memory cell 10' to produce the waveforms shown in FIG. 6. Similar to the timing diagram in FIG. 5, waveform (a) depicts the control signal $\overline{\text{ENABLE}}$ which enables the memory cell 10' and causes the memory cell 10' to output the data item stored in the memory cell 10' at the DATA output terminal 30'. When the $\overline{\text{ENABLE}}$ signal is high or asserted, the memory cell 10' is not enabled and does not output the data item at the DATA output terminal 30'. When the $\overline{\text{ENABLE}}$ signal is low or unasserted, the memory cell 10' is enabled and outputs the data item stored in the memory cell 10' at the DATA output terminal 30'. Also similar to the timing diagram in FIG. 5, waveform (b) represents the state of the signal $L_{IN}$ at the input terminal 28' of the latch 16' and waveform (c) represents the state of the DATA signal at the DATA output terminal 30'.

To read the data item stored in the memory cell 10', the latch 16' of the memory cell 10' is first preset to a known state (REGION I). In the embodiment illustrated by the timing diagram in FIG. 6, the latch 16' is preset such that the DATA signal is low or unasserted when the $\overline{\text{ENABLE}}$ signal is high or asserted. When the memory cell 10' is powered up, to preset the latch 16' the $\overline{\text{ENABLE}}$ signal is high or asserted. The diode 14' forces the latch 16' to the known state and thereby causes the signal $L_{IN}$ to be pulled high. Without the diode 14', the signal $L_{IN}$ could be low or unasserted upon powering up the memory cell 10' and the memory cell 10' may not be able to recover and function properly.

Next, the memory cell 10' is enabled (REGION II). To enable the memory cell 10', the $\overline{\text{ENABLE}}$ signal switches low or is unasserted. As the trimmable resistor $R_{DATA}$ 12 is trimmed, the state of the signal $L_{IN}$ remains high or asserted and the state of the DATA signal remains low or unasserted. After the data item stored in the memory cell 10' has been read, the memory cell 10' is disabled or "shutdown" (REGION III). In addition to conserving power, another purpose of shutting down the memory cell 10' is to allow the data item to be stored in the memory cell 10' by only partially trimming the resistor $R_{DATA}$ 12 rather than requiring the resistor $R_{DATA}$ 12 to be completely removed. Shutting down the memory cell 10' after the data item stored in the memory cell 10' is read prevents a current from leaking through any remnants of the resistor $R_{DATA}$ 12 if the resistor $R_{DATA}$ 12 has been only partially trimmed and not completely removed from the memory cell 10'. If the resistor $R_{DATA}$ 12 is only partially trimmed and the $\overline{\text{ENABLE}}$ signal remains low or unasserted, a leakage path through the resistor $R_{DATA}$ 12 may be created as the input terminal 28' of the latch 16' is at $V_{DD}$. To prevent the leakage current and shut down the memory cell 10', the $\overline{\text{ENABLE}}$ signal switches high. During shutdown (REGION III), the $\overline{\text{ENABLE}}$ signal is high or asserted, and the diode 14' pulls the signal $L_{IN}$ high which causes the latch 16' to reset to the known state of the DATA signal (low or unasserted). As both the $\overline{\text{ENABLE}}$ signal and the $L_{IN}$ signal are high or asserted during shutdown, there is no potential across the resistor $R_{DATA}$ 12 and therefore no leakage current.

In another embodiment, a plurality of memory cells 10' are used to store a plurality of data items as described above.

Having described preferred embodiments of the invention, it will now become apparent to one of skill in the art that other embodiments incorporating the concepts may be used. It is felt, therefore, that these embodiments should not be limited to disclosed embodiments, but rather should be limited only by the spirit and scope of the following claims.

What is claimed is:

1. A memory cell, comprising:
    a trimmable resistor having a first terminal and a second terminal;
    a latch having an input terminal in electrical communication with said second terminal of said trimmable resistor and an output terminal, said latch being in a first state when said trimmable resistor is untrimmed and being in a second state when said trimmable resistor is trimmed; and
    a diode having a first terminal in electrical communication with said first terminal of said trimmable resistor and a second terminal in electrical communication with said second terminal of said trimmable resistor.

2. The memory cell of claim 1 wherein said trimmable resistor is trimmable by radiant energy.

3. The memory cell of claim 2 wherein the radiant energy is obtained from a pulsed laser.

4. The memory cell of claim 1 wherein said diode has a cathode and an anode, said cathode being said first terminal of said diode and said anode being said second terminal of said diode.

5. The memory cell of claim 1 wherein said diode is a field effect transistor having a source terminal being said first terminal of said diode, a drain terminal being said second terminal of said diode, and a gate terminal in electrical communication with said drain terminal.

6. The memory cell of claim 1 wherein said latch further comprises:
    a first field effect transistor having a drain terminal in electrical communication with said input terminal of said latch, a gate terminal in electrical communication with said output terminal of said latch, and a source terminal in electrical communication with a first reference voltage;
    a second field effect transistor having a gate terminal in electrical communication with said input terminal of said latch, a source terminal in electrical communication with the first reference voltage, and a drain terminal in electrical communication with said output terminal of said latch; and
    a third field effect transistor having a gate terminal in electrical communication with said input terminal of said latch, a source terminal in electrical communication with a second reference voltage, and a drain terminal in electrical communication with said output terminal of said latch.

7. A method of storing data in a memory cell, comprising the steps of:
    (a) providing a memory cell comprising:
        a trimmable resistor having a first terminal and a second terminal;
        a latch having an input terminal in electrical communication with said second terminal of said trimmable resistor and an output terminal, said latch being in a first state when said trimmable resistor is untrimmed and being in a second state when said trimmable resistor is trimmed; and
        a diode having a first terminal in electrical communication with said first terminal of said trimmable resistor and a second terminal in electrical communication with said second terminal of said trimmable resistor; and
    (b) trimming said trimmable resistor to store a data item.

8. The method of claim 7 wherein said trimmable resistor is capable of being trimmed by radiant energy and the step of trimming said trimmable resistor further comprises the step of subjecting said trimmable resistor to a predetermined quantity of radiant energy.

9. The method of claim 8 wherein the step of subjecting said trimmable resistor to a predetermined quantity of radiant energy further comprises the step of subjecting said trimmable resistor to radiant energy from a pulsed laser.

\* \* \* \* \*